US012763762B2

(12) United States Patent
Chang

(10) Patent No.: US 12,763,762 B2
(45) Date of Patent: Oct. 13, 2026

(54) DUTY CYCLE CORRECTION DEVICE AND DUTY CYCLE CORRECTION METHOD THEREOF

(71) Applicant: NANYA TECHNOLOGY CORPORATION, New Taipei City (TW)

(72) Inventor: Chia-Hao Chang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 26 days.

(21) Appl. No.: 18/959,454

(22) Filed: Nov. 25, 2024

(65) Prior Publication Data

US 2026/0149440 A1 May 28, 2026

(51) Int. Cl.
*H03K 5/156* (2006.01)
*H03K 5/13* (2014.01)

(52) U.S. Cl.
CPC ............. *H03K 5/1565* (2013.01); *H03K 5/13* (2013.01)

(58) Field of Classification Search
CPC ............................... H03K 5/1565; H03K 5/13
See application file for complete search history.

(56) References Cited

U.S. PATENT DOCUMENTS 6,424,178 B1 * 7/2002 Harrison .................. G06F 1/08 327/175
6,781,419 B2 * 8/2004 Harrison .............. H03K 5/1565 326/98
9,654,093 B2 * 5/2017 Yun ......................... H03L 7/085
10,418,983 B1 9/2019 Lee
11,368,142 B1 * 6/2022 Kuzmenka ............. H03K 3/017
11,595,028 B2 * 2/2023 Moslehi Bajestan ..... H03L 7/16
12,088,300 B2 * 9/2024 Kuzmenka ............. H03K 3/017
2017/0187364 A1 * 6/2017 Park ........................ H03L 7/093
2019/0214976 A1 * 7/2019 Wu ........................ H03L 7/0805
2023/0115436 A1 * 4/2023 Yang .................... H03K 5/1565 327/175
2024/0030902 A1 * 1/2024 Kuzmenka ............. H03K 3/017
2025/0379570 A1 * 12/2025 Li ........................ H03K 5/1565

FOREIGN PATENT DOCUMENTS

WO 2020150977 A1 7/2020

OTHER PUBLICATIONS

"Office Action of Taiwan counterpart Application", issued on Oct. 13, 20, 2025, p. 1-p. 5.

* cited by examiner

*Primary Examiner* — Thomas J. Hiltunen
*Assistant Examiner* — Khareem E Almo
(74) *Attorney, Agent, or Firm* — JCIPRNET

(57) ABSTRACT

A duty cycle correction device and a duty cycle correction method thereof are disclosed. A duty cycle adjustment circuit adjusts a duty cycle of an input clock signal to output an output clock signal. An integrator circuit generates an integral signal according to the output clock signal. A correction control circuit periodically controls the duty cycle adjustment circuit to adjust an adjustment amount of the duty cycle according to a change of a logic level of the integral signal.

10 Claims, 6 Drawing Sheets

DUTY CYCLE CORRECTION DEVICE AND DUTY CYCLE CORRECTION METHOD THEREOF

BACKGROUND

Technical Field

This disclosure relates to an electronic device, and in particular to a duty cycle correction device and a duty cycle correction method thereof.

Description of Related Art

Duty Cycle Correction devices can be used to correct the duty cycle of a signal to maintain the duty cycle of the signal at a preset percentage, thereby improving the signal quality of the system and ensuring proper operation. Therefore, it may be important to provide a duty cycle correction device that can quickly and accurately correct the duty cycle of a signal.

SUMMARY

The disclosure provides a duty cycle correction device and a duty cycle correction method thereof, capable of quickly and accurately correcting a duty cycle of a signal.

The duty cycle correction device of the disclosure includes a duty cycle adjustment circuit, an integrator circuit, and a correction control circuit. The duty cycle adjustment circuit adjusts a duty cycle of an input clock signal to output an output clock signal. The integrator circuit is coupled to the duty cycle adjustment circuit and generates an integral signal according to the output clock signal. The correction control circuit is coupled to the integrator circuit and the duty cycle adjustment circuit, and periodically controls the duty cycle adjustment circuit to adjust an adjustment amount of the duty cycle according to a change of a logic level of the integral signal.

In an embodiment of the disclosure, when the logic level of the integral signal changes more than n times during a preset cycle period, the correction control circuit controls the duty cycle adjustment circuit to reduce the adjustment amount.

In an embodiment of the disclosure, n is an integer greater than 1.

In an embodiment of the disclosure, the correction control circuit includes a multiplier circuit, an adder circuit, and a control circuit. The multiplier circuit is coupled to the integrator circuit and provides a product value according to the integral signal. A first input terminal of the adder circuit is coupled to the multiplier circuit, a second input terminal of the adder circuit is coupled to an output terminal, the output terminal of the adder circuit is coupled to the duty cycle adjustment circuit, outputting a control code to the duty cycle adjustment circuit to control the duty cycle adjustment circuit to adjust the adjustment amount of the duty cycle. The control circuit is coupled to the multiplier circuit and the adder circuit, periodically controls the multiplier circuit to adjust the product value according to the change of the logic level of the integral signal, and controls the adder circuit to add the product value to or subtract the product value from the control code according to the logic level of the integral signal to control the duty cycle adjustment circuit to adjust the adjustment amount of the duty cycle.

In an embodiment of the disclosure, the control circuit stops adjusting the product value in response to the product value being less than or equal to a preset product value.

In an embodiment of the disclosure, the integrator circuit includes a differential signal conversion circuit, a first comparator, a first resistor, a second resistor, a first capacitor, a second capacitor, and a second comparator. The differential signal conversion circuit is coupled to an output terminal of the duty cycle adjustment circuit, and converts the output clock signal into a differential signal. The first resistor is coupled between the differential signal conversion circuit and a positive input terminal of the first comparator. The second resistor is coupled between the differential signal conversion circuit and a negative input terminal of the first comparator. The first capacitor is coupled between a positive input terminal of the first comparator and a ground. The second capacitor is coupled between a negative input terminal of the first comparator and the ground. A positive input terminal and a negative input terminal of the second comparator are coupled to a negative output terminal and a positive output terminal of the first comparator respectively. An output terminal of the second comparator is coupled to the correction control circuit. The output terminal of the second comparator is used to output the integral signal.

In an embodiment of the disclosure, the duty cycle correction device further includes a delay circuit coupled between the duty cycle adjustment circuit and the integrator circuit.

The disclosure also provides a duty cycle correction method of a duty cycle correction device. The duty cycle correction device includes a duty cycle adjustment circuit. The duty cycle adjustment circuit adjusts a duty cycle of an input clock signal to output an output clock signal. The duty cycle correction method includes the following. The output clock signal is provided to an integrator circuit to generate an integral signal. The duty cycle adjustment circuit is periodically controlled to adjust an adjustment amount of the duty cycle according to a change of a logic level of the integral signal.

In an embodiment of the disclosure, the duty cycle correction method of the duty cycle correction device includes the following. Whether the logic level of the integral signal changes more than n times during a preset cycle period is determined. When the logic level of the integral signal changes more than n times during the preset cycle period, the duty cycle adjustment circuit is controlled to reduce the adjustment amount.

In an embodiment of the disclosure, n is an integer greater than 1.

In an embodiment of the disclosure, the duty cycle correction method of the duty cycle correction device includes the following. A provided product value is periodically adjusted according to the change of the logic level of the integral signal. The product value is added to or subtracted from a control code according to the logic level of the integral signal. The control code is outputted to the duty cycle adjustment circuit to control the duty cycle adjustment circuit to adjust the adjustment amount of the duty cycle.

In an embodiment of the disclosure, the duty cycle correction method of the duty cycle correction device includes stopping adjusting the product value in response to the product value being less than or equal to a preset product value.

Based on the above, the integrator circuit of the embodiment of the disclosure generates an integral signal according to the output clock signal of the duty cycle adjustment circuit, and the correction control circuit periodically controls the duty cycle adjustment circuit to adjust the adjustment amount of the duty cycle according to the change of the logic level of the integral signal. In this way, the duty cycle of the output clock signal can be quickly and accurately corrected, improving the signal quality of the system using the duty cycle correction device and ensuring proper operation of the system.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Figure 1:
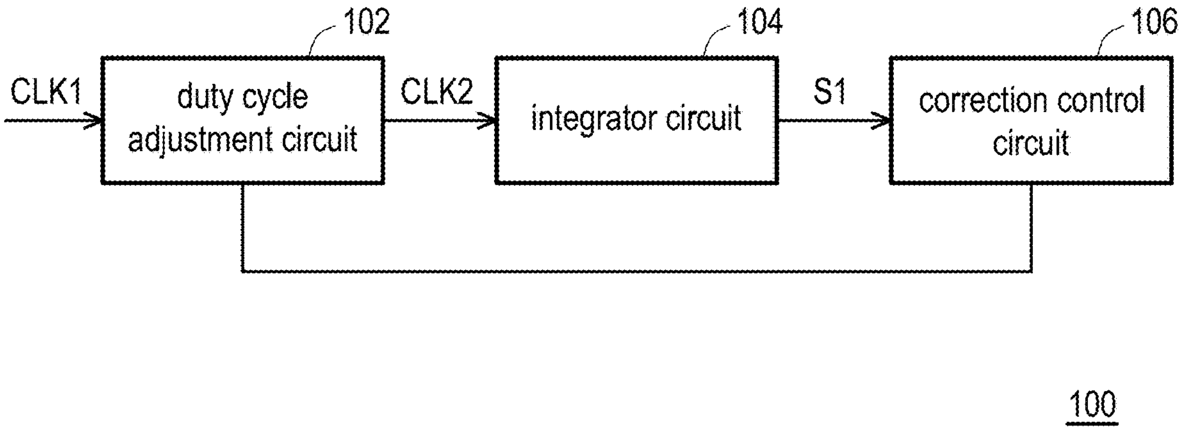
FIG. 1 is a schematic diagram of a duty cycle correction device according to an embodiment of the disclosure.

FIG. 1 is a schematic diagram of a duty cycle correction device according to an embodiment of the disclosure. Please refer to FIG. 1. A duty cycle correction device 100 includes a duty cycle adjustment circuit 102, an integrator circuit 104, and a correction control circuit 106. The integrator circuit 104 is coupled to the duty cycle adjustment circuit 102 and the correction control circuit 106. The correction control circuit 106 is also coupled to the duty cycle adjustment circuit 102.

The duty cycle adjustment circuit 102 is used to adjust a duty cycle of an input clock signal CLK1 to output an output clock signal CLK2. The integrator circuit 104 generates an integral signal S1 according to the output clock signal CLK2. The correction control circuit 106 can periodically control the duty cycle adjustment circuit 102 to adjust an adjustment amount of the duty cycle of the input clock signal CLK1 according to a change of a logic level of the integral signal S1. For example, when the number of times of the change of the logic level of the integrating signal S1 during a preset period is greater than n times, the correction control circuit 106 may control the duty cycle adjustment circuit 102 to reduce the adjustment amount. n is an integer greater than 1. The number of times of the change of the logic level can be, for example, the number of times the count changes from high logic level to low logic level and from low logic level to high logic level, or the number of times the count changes from high logic level to low logic level only, or the number of times the count changes from low logic level to high logic level only. In this way, the duty cycle of the output clock signal can be quickly and accurately corrected, improving the signal quality of the system using the duty cycle correction device and ensuring proper operation of the system.

Figure 2:
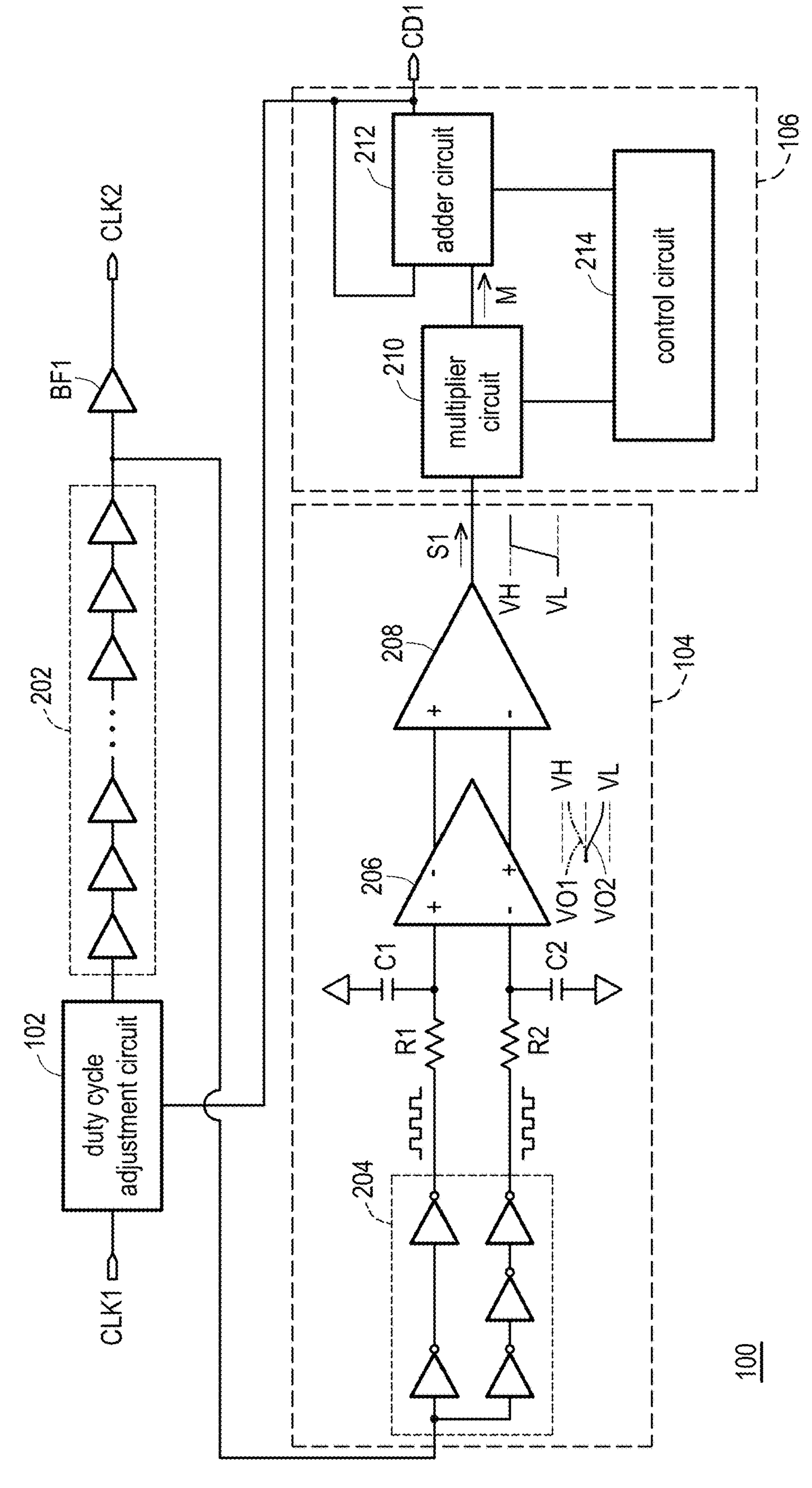
FIG. 2 is a schematic diagram of a duty cycle correction device according to another embodiment of the disclosure.

Furthermore, the implementation of the duty cycle correction device 100 can be shown in FIG. 2. In the embodiment of FIG. 2, the duty cycle correction device 100 may further include a delay circuit 202. The delay circuit 202 is coupled between the duty cycle adjustment circuit 102 and the integrator circuit 104. The delay circuit 202 may delay the output of the output clock signal CLK2, which may be implemented, for example, with multiple buffers. In addition, the delay circuit 202 can also output the output clock signal CLK2 through a buffer BF1, but is not limited thereto. In other embodiments, the delay circuit 202 can also directly output the output clock signal CLK2.

The integrator circuit 104 may include a differential signal conversion circuit 204, a comparator 206, a comparator 208, resistors R1, R2, and capacitors C1, C2. The differential signal conversion circuit 204 is coupled to the delay circuit 202 and coupled to the positive and negative input terminals of the comparator 206 through the resistors R1 and R2. Furthermore, the differential signal conversion circuit 204 may include multiple first inverters connected in series between the delay circuit 202 and the resistor R1 and multiple second inverters connected in series between the delay circuit 202 and the resistor R2. The number of the first inverters may be an even number, and the number of the second inverters may be an odd number, but the number is not limited thereto. For example, in other embodiments, the number of the first inverters may be an odd number, and the number of the second inverters may be an even number. The capacitor C1 is coupled between the positive input terminal of the comparator 206 and the ground, and the capacitor C2 is coupled between the negative input terminal of the comparator 206 and the ground. The positive and negative input terminals of the comparator 208 are coupled to the negative and positive output terminals of the comparator 206 respectively, and the output terminal of the comparator 208 is coupled to the correction control circuit 106.

In this embodiment, the correction control circuit 106 may include a multiplier circuit 210, an adder circuit 212, and a control circuit 214. The multiplier circuit 210 is coupled to the integrator circuit 104, the adder circuit 210, and the control circuit 214. The adder circuit 212 is also coupled to the control circuit 214 and the duty cycle adjustment circuit 102. In addition, an input terminal of the adder circuit 212 is coupled to the output terminal.

Figure 3:
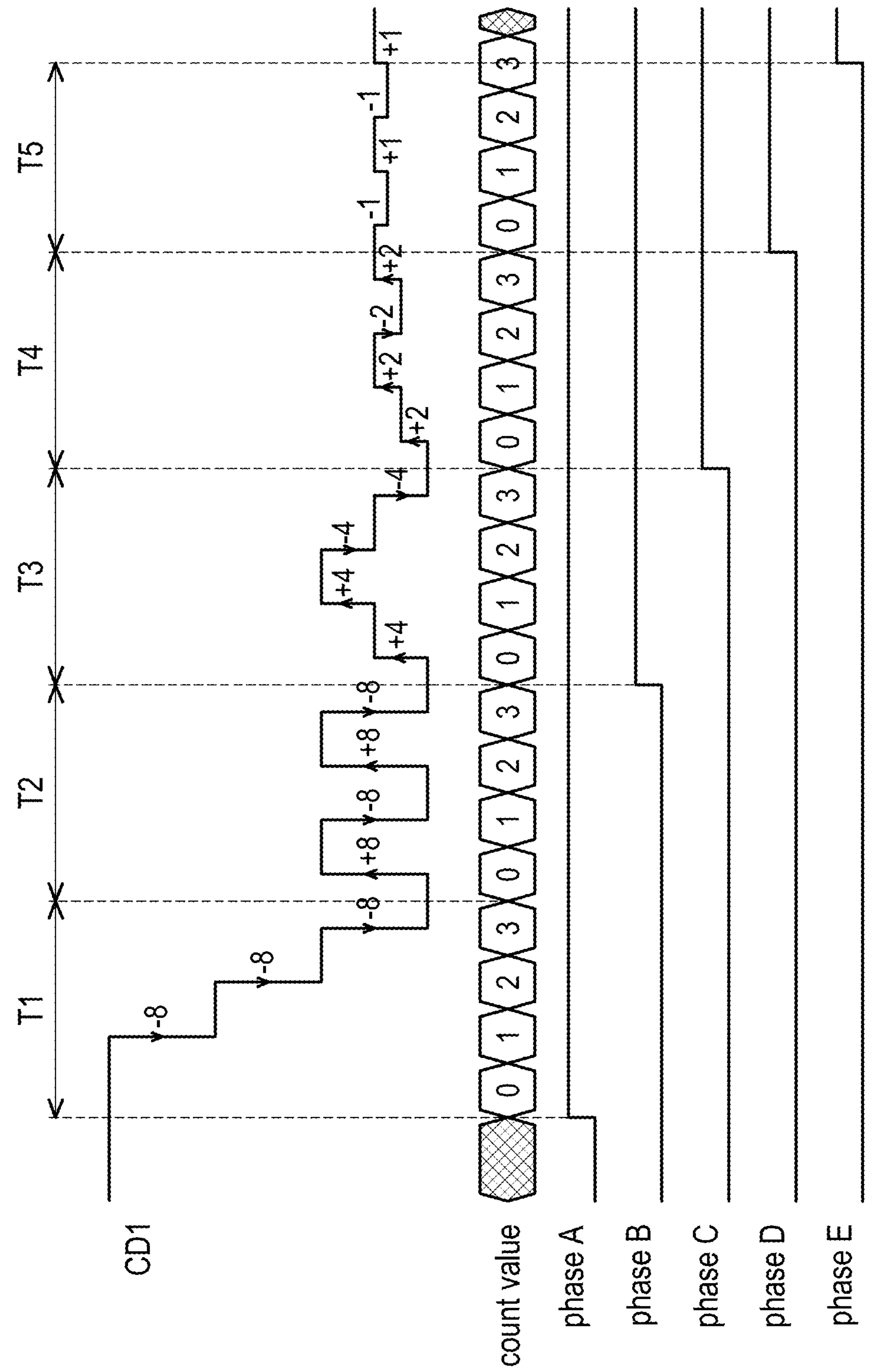
FIG. 3 is an operation timing diagram of a duty cycle correction device according to an embodiment of the disclosure.

The differential signal conversion circuit 204 can convert the output clock signal CLK2 into a differential signal. In this embodiment, the differential signal includes two clock signals with opposite phases. The differential signal is converted into the integral signal S1 through the resistors R1 and R2, the capacitors C1 and C2, the comparator 206, and the comparator 208, and is output to the multiplier circuit 210. As shown in FIG. 2, as the duty ratio of the output clock signal CLK2 increases, the output voltage of the comparator 206 will approach the high voltage logic level VH (shown as the output curve VO1), and as the duty ratio of the output clock signal CLK2 decreases, the output voltage of the comparator 206 will approach the low voltage logic level VL (shown as the voltage curve VO2). The comparator 208 may generate the integral signal S1 according to the output voltage of the comparator 206. When the output voltage of the comparator 206 corresponds to the output curve VO1, the comparator 208 generates the integral signal S1 at a high voltage logic level (as shown in FIG. 2), and when the output voltage of the comparator 206 corresponds to the output curve VO2, the comparator 208 generates the integral signal S1 at a low voltage logic level. The multiplier circuit 210 can provide a product value according to the integral signal S1. For example, as shown in FIG. 3, the multiplier circuit 210 can provide different product values M at different phases. The product value M can be, for example, 8, 4, 2, or 1, but not limited thereto. The adder circuit 212 is used to output a control code CD1 to the duty cycle adjustment circuit 102 to control the duty cycle adjustment circuit 102 to adjust the adjustment amount of the duty cycle of the input clock signal CLK1. The control circuit 214 can periodically control the multiplier circuit 210 to adjust the product value M according to the change of the logic level of the integral signal S1, and control the adder circuit 212 to add or subtract the product value M to the control code CD1 according to the logic level of the integral signal S1, so as to control the duty cycle adjustment circuit 102 to adjust the adjustment amount of the duty cycle of the input clock signal CLK1.

For example, in the embodiment of FIG. 3, the control circuit 214 can perform a counting operation (such as counting the rising edge of the basic clock signal) to generate a count value, and the count value is reset when it accumulates to a preset value (e.g., 3, but not limited thereto). The control circuit 214 can control the adder circuit 212 to add or subtract the product value M to the control code CD1 according to the logic level of the integral signal S1. For example, when the integral signal S1 is at a high logic level, the product value M is subtracted from the control code CD1. When the integral signal S1 is at a low logic level, the product value M is added to the control code CD1, but not limited thereto. In other embodiments, it can also be set that when the integral signal S1 is at a high logic level, the product value M is added to the control code CD1, and when the integral signal S1 is at a low logic level, the product value M is subtracted from the control code CD1.

In addition, the control circuit 214 can periodically determine whether it is necessary to control the multiplier circuit 210 to adjust the product value M according to the change of the logic level of the integral signal S1. For example, in the embodiment of FIG. 3, the control circuit 214 may determine whether it is necessary to control the multiplier circuit 210 to adjust the product value M according to the change in the logic level of the integral signal S1 during each cycle period defined by the count value (i.e., the preset cycle period, which is the period during which the count value is accumulated from 0 to 3 in the embodiment of FIG. 3). Further, the control circuit 214 may determine whether or not to control the multiplier circuit 210 to adjust the product value M by determining the number of times of the change of the logic level of the integral signal S1 during each cycle period defined by the count value. For example, it can be set that when the number of times of the change of the logic level of the integral signal S1 is greater than one time during the cycle period defined by the count value, the multiplier circuit 210 is controlled to adjust the product value M.

As shown in FIG. 3, assuming that the product value M is equal to 8 when entering a phase A, during a cycle period T1, the control circuit 214 can continuously control the adder circuit 212 to subtract the product value M from the control code CD1 in response to the integral signal S1 being at a high logic level. Since the number of times of the change of the logic level of the integral signal S1 during the cycle period T1 is not greater than 1, the control circuit 214 does not control the multiplier circuit 210 to adjust the product value M. During the cycle period T1, the integral signal S1 changes four times between the high logic level and the low logic level, and the control circuit 214 controls the adder circuit 212 to add to or subtract the product value M from the control code CD1 in response to the change of logic level of the integral signal S1. Since the number of times of the change of the logic level of the integral signal S1 during a cycle period T2 is greater than 1, the control circuit 214 enters a phase B and controls the multiplier circuit 210 to reduce the product value M to 4. By analogy, during cycle periods T3 to T5, the number of times of the change of the logic level of the integral signal S1 is greater than 1, so the control circuit 214 continuously controls the multiplier circuit 210 to reduce the product value M.

In addition, the control circuit 214 can determine whether the product value M is less than or equal to a preset product value. When the product value M is less than or equal to the preset value, it means that the duty cycle is close to the target duty cycle, and the control circuit 214 can end the adjustment of the product value M, i.e., stop adjusting the adjustment amount of the duty cycle. For example, in the embodiment of FIG. 3, the preset product value can be set to 1, and after the end of the cycle period T5, the control circuit 214 enters a phase E and stops adjusting the product value M.

Figure 4:
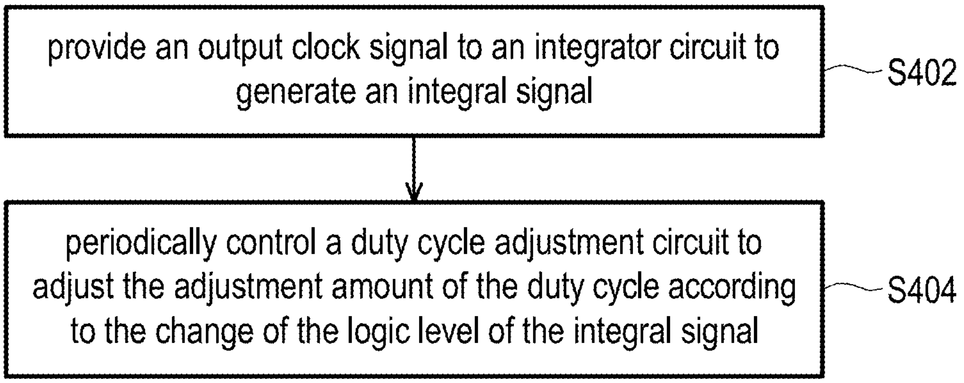
FIG. 4 is a flow chart of a duty cycle correction method of a duty cycle correction device according to an embodiment of the disclosure.

FIG. 4 is a flow chart of a duty cycle correction method of a duty cycle correction device according to an embodiment of the disclosure. The duty cycle correction device includes a duty cycle adjustment circuit, and the duty cycle adjustment circuit uses the duty cycle of the adjusted input clock signal to output the output clock signal. The duty cycle correction method of the duty cycle correction device may include at least the following steps. First, the output clock signal is provided to the integrator circuit to generate an integral signal (step S402). Then, the duty cycle adjustment circuit is periodically controlled to adjust the adjustment amount of the duty cycle according to the change of the logic level of the integral signal (step S404).

Figure 5:
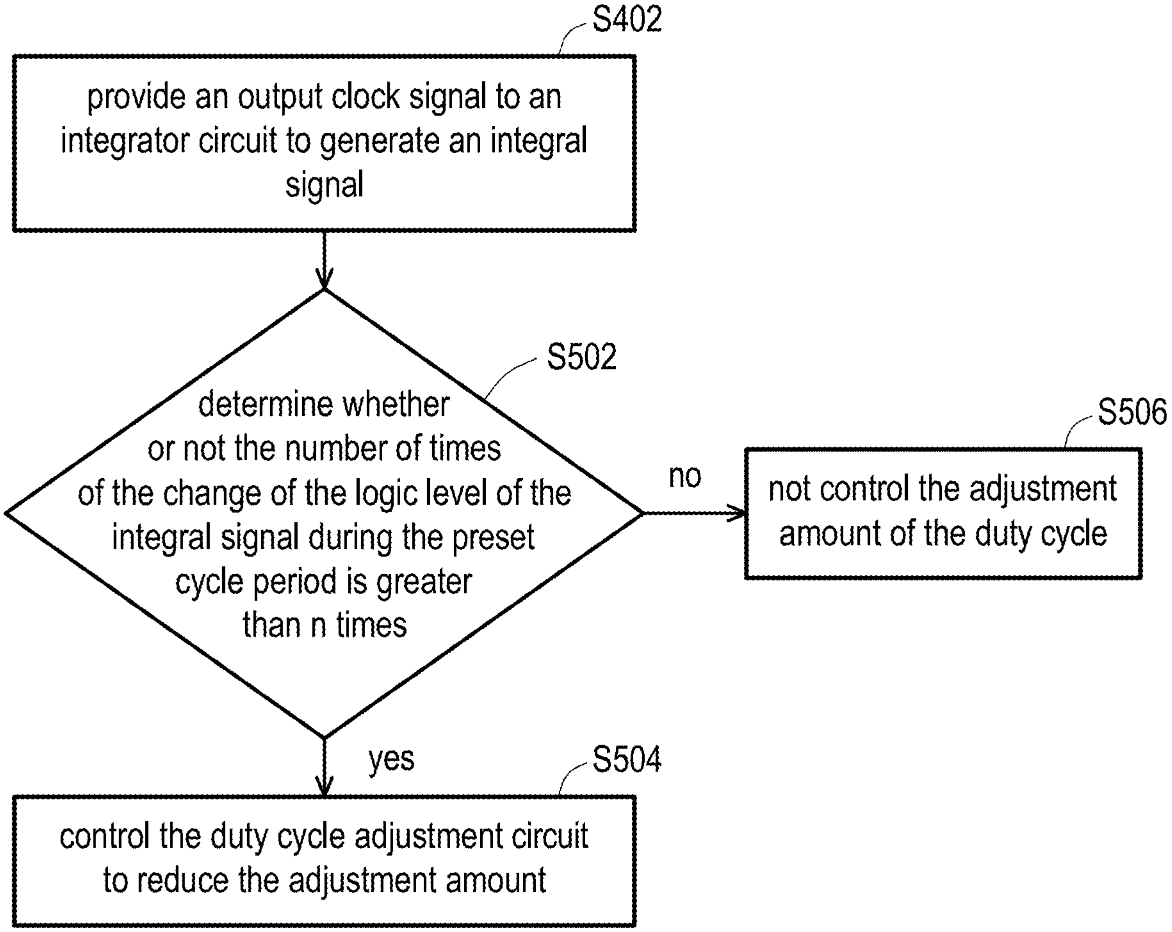
FIG. 5 is a flow chart of a duty cycle correction method of a duty cycle correction device according to another embodiment of the disclosure.

Furthermore, the method of periodically adjusting the adjustment amount of the duty cycle according to the change of the logic level of the integral signal is shown in FIG. 5. After step S402, it is determined whether or not the number of times of the change of the logic level of the integral signal during the preset cycle period is greater than n times (step S502), where n is an integer greater than 1. If the number of times of the change is greater than n times, the duty cycle adjustment circuit is controlled to reduce the adjustment amount (step S504). If the number of times of the change is not greater than n, the duty cycle adjustment circuit is not controlled to reduce the adjustment amount (step S506).

Figure 6:
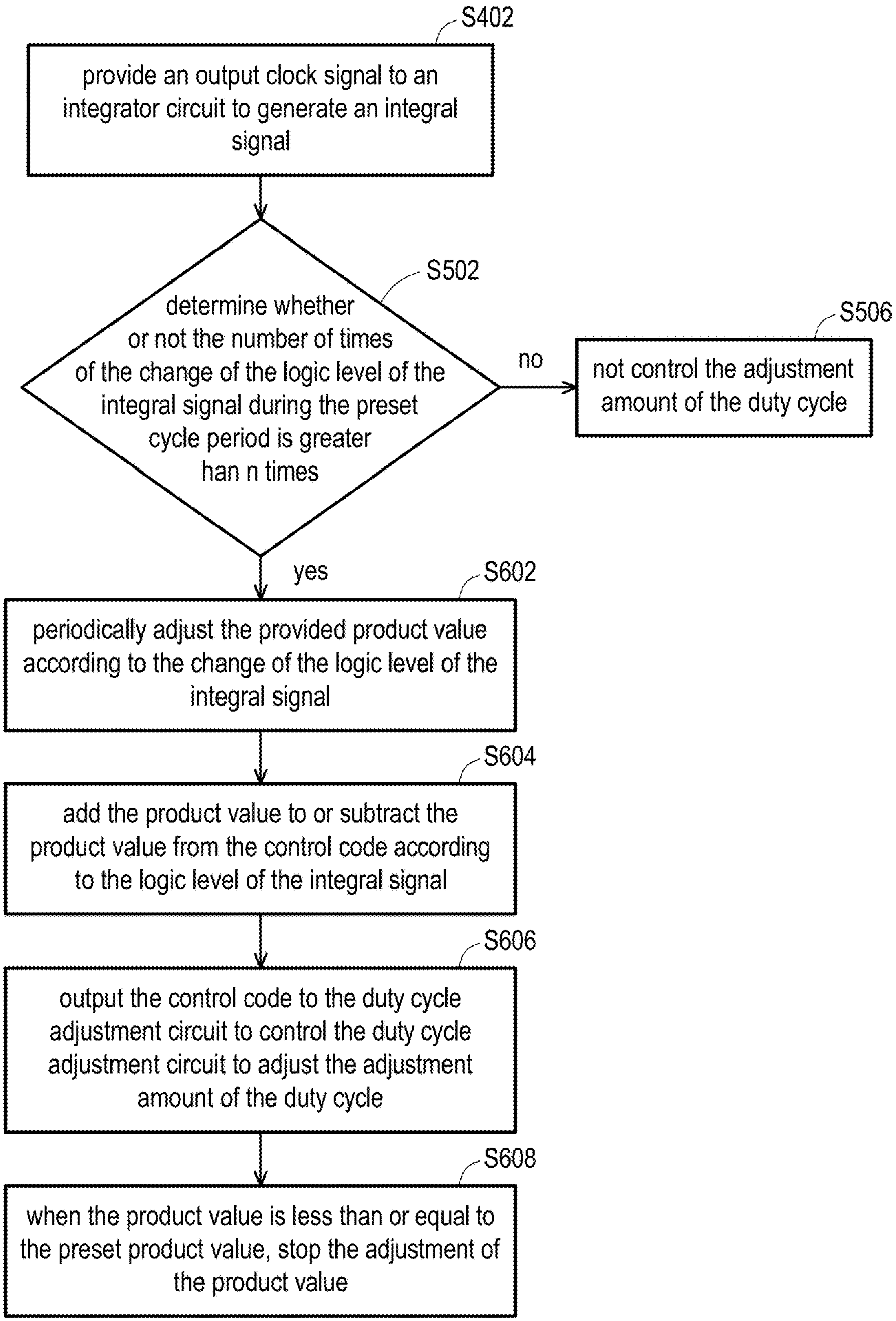
FIG. 6 is a flow chart of a duty cycle correction method of a duty cycle correction device according to another embodiment of the disclosure.

In some embodiments, adjusting the adjustment amount of the duty cycle may be implemented, for example, by adjusting the product value generated according to the integral signal. For example, in the embodiment of FIG. 6, the provided product value can be periodically adjusted according to the change of the logic level of the integral signal (step S602). For example, when the number of times of the change of the logic level of the integral signal is greater than n times during the preset cycle period, the provided product value can be reduced. Then the product value is added to or subtracted from the control code according to the logic level of the integral signal (step S604). For example, when the integral signal is at a high logic level, the product value is subtracted from the control code, and when the integral signal is at a low logic level, the product value is added to the control code, but it is not limited thereto. In other embodiments, it can also be set that when the integral signal is at a high logic level, the product value is added to the control code, and when the integral signal is at a low logic level, the product value is subtracted from the control code. After that, the adjusted control code is output to the duty cycle adjustment circuit to control the duty cycle adjustment circuit to adjust the adjustment amount of the duty cycle (step S606). In addition, when the product value is adjusted to be less than or equal to the preset product value, the adjustment of the product value is stopped (step S608), that is, the adjustment of the adjustment amount of the duty cycle is stopped.

To sum up, the integrator circuit of the embodiment of the disclosure generates an integral signal according to the output clock signal of the duty cycle adjustment circuit, and the correction control circuit periodically controls the duty cycle adjustment circuit to adjust the adjustment amount of the duty cycle according to the change of the logic level of the integral signal. In this way, the duty cycle of the output clock signal can be quickly and accurately corrected, improving the signal quality of the system using the duty cycle correction device and ensuring proper operation of the system.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A duty cycle correction device, comprising:
- a duty cycle adjustment circuit, adjusting a duty cycle of an input clock signal to output an output clock signal;
- an integrator circuit, coupled to the duty cycle adjustment circuit, generating an integral signal according to the output clock signal; and
- a correction control circuit, coupled to the integrator circuit and the duty cycle adjustment circuit, periodically controlling the duty cycle adjustment circuit to adjust an adjustment amount of the duty cycle according to a change of a logic level of the integral signal,
- wherein when the logic level of the integral signal changes more than n times during a preset cycle period, the correction control circuit controls the duty cycle adjustment circuit to reduce the adjustment amount.

2. The duty cycle correction device according to claim 1, wherein n is an integer greater than 1.

3. The duty cycle correction device according to claim 1, wherein the correction control circuit comprises:
- a multiplier circuit, coupled to the integrator circuit, providing a product value according to the integral signal;
- an adder circuit, wherein a first input terminal of the adder circuit is coupled to the multiplier circuit, a second input terminal of the adder circuit is coupled to an output terminal, the output terminal of the adder circuit is coupled to the duty cycle adjustment circuit, outputting a control code to the duty cycle adjustment circuit to control the duty cycle adjustment circuit to adjust the adjustment amount of the duty cycle; and
- a control circuit, coupled to the multiplier circuit and the adder circuit, periodically controlling the multiplier circuit to adjust the product value according to the change of the logic level of the integral signal, and controlling the adder circuit to add the product value to or subtract the product value from the control code according to the logic level of the integral signal to control the duty cycle adjustment circuit to adjust the adjustment amount of the duty cycle.

4. The duty cycle correction device according to claim 3, wherein the control circuit stops adjusting the product value in response to the product value being less than or equal to a preset product value.

5. The duty cycle correction device according to claim 1, wherein the integrator circuit comprises:
- a differential signal conversion circuit, coupled to an output terminal of the duty cycle adjustment circuit, converting the output clock signal into a differential signal;
- a first comparator;
- a first resistor, coupled between the differential signal conversion circuit and a positive input terminal of the first comparator;
- a second resistor, coupled between the differential signal conversion circuit and a negative input terminal of the first comparator;
- a first capacitor, coupled between a positive input terminal of the first comparator and a ground;
- a second capacitor, coupled between a negative input terminal of the first comparator and the ground; and
- a second comparator, wherein a positive input terminal and a negative input terminal of the second comparator are coupled to a negative output terminal and a positive output terminal of the first comparator respectively, an output terminal of the second comparator is coupled to the correction control circuit, outputting the integral signal.

6. The duty cycle correction device according to claim 1 further comprising:
- a delay circuit, coupled between the duty cycle adjustment circuit and the integrator circuit.

7. A duty cycle correction method of a duty cycle correction device, the duty cycle correction device comprising a duty cycle adjustment circuit, wherein the duty cycle adjustment circuit adjusts a duty cycle of an input clock signal to output an output clock signal, and the duty cycle correction method of the duty cycle correction device comprises:
- providing the output clock signal to an integrator circuit to generate an integral signal; and
- periodically controlling the duty cycle adjustment circuit to adjust an adjustment amount of the duty cycle according to a change of a logic level of the integral signal,
- determining whether the logic level of the integral signal changes more than n times during a preset cycle period; and
- when the logic level of the integral signal changes more than n times during the preset cycle period, controlling the duty cycle adjustment circuit to reduce the adjustment amount.

8. The duty cycle correction method of the duty cycle correction device according to claim 7, where n is an integer greater than 1.

9. The duty cycle correction method of the duty cycle correction device according to claim 7, comprising:
- periodically adjusting a provided product value according to the change of the logic level of the integral signal;
- adding the product value to or subtracting the product value from a control code according to the logic level of the integral signal; and
- outputting the control code to the duty cycle adjustment circuit to control the duty cycle adjustment circuit to adjust the adjustment amount of the duty cycle.

10. The duty cycle correction method of the duty cycle correction device according to claim 9, comprising:

stopping adjusting the product value in response to the product value being less than or equal to a preset product value.

* * * * *